United States Patent
Mayer et al.

(10) Patent No.: US 11,592,292 B2
(45) Date of Patent: Feb. 28, 2023

(54) TOTAL STATION OR THEODOLITE HAVING SCANNING FUNCTIONALITY AND SETTABLE RECEIVING RANGES OF THE RECEIVER

(71) Applicant: HEXAGON TECHNOLOGY CENTER GMBH, Heerbrugg (CH)

(72) Inventors: Tim Mayer, Horn (CH); Jürg Hinderling, Marbach (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 1042 days.

(21) Appl. No.: 16/116,811

(22) Filed: Aug. 29, 2018

(65) Prior Publication Data

US 2019/0063914 A1 Feb. 28, 2019

(30) Foreign Application Priority Data

Aug. 30, 2017 (EP) ..................... 17188474

(51) Int. Cl.
| | |
|---|---|
| G01C 3/08 | (2006.01) |
| G01C 1/04 | (2006.01) |
| H01L 31/107 | (2006.01) |
| G01C 15/00 | (2006.01) |
| G01S 17/42 | (2006.01) |
| G01S 7/481 | (2006.01) |
| G01S 17/10 | (2020.01) |
| G01S 7/4863 | (2020.01) |
| G01S 17/89 | (2020.01) |

(52) U.S. Cl.
CPC ............ *G01C 1/04* (2013.01); *G01C 15/002* (2013.01); *G01S 7/4816* (2013.01); *G01S 7/4817* (2013.01); *G01S 7/4863* (2013.01); *G01S 17/10* (2013.01); *G01S 17/42* (2013.01); *G01S 17/89* (2013.01); *H01L 31/107* (2013.01)

(58) Field of Classification Search
None
See application file for complete search history.

(56) References Cited

U.S. PATENT DOCUMENTS

| | | |
|---|---|---|
| 6,504,602 B1 | 1/2003 | Hinderling |
| 2008/0069406 A1 | 3/2008 | Matsuo et al. |
| 2012/0249998 A1 | 10/2012 | Eisele et al. |

(Continued)

FOREIGN PATENT DOCUMENTS

| | | |
|---|---|---|
| CN | 101149260 A | 3/2008 |
| EP | 1081459 A1 | 8/1999 |

(Continued)

OTHER PUBLICATIONS

European Search Report dated Feb. 22, 2018 in application No. 17188474.5.

*Primary Examiner* — Mark Hellner
(74) *Attorney, Agent, or Firm* — Maschoff Brennan

(57) ABSTRACT

A total station or a theodolite includes scanning functionality for optical surveying of an environment, in which the total station or the theodolite is configured such that direction-dependent active acquisition regions of the receiver are defined depending on the transmission direction of the transmitted radiation to adapt the receiver surface mechanically and/or electronically to a varying imaging position of the received radiation on the overall detector surface.

16 Claims, 7 Drawing Sheets

(56) References Cited

U.S. PATENT DOCUMENTS

| | | | |
|---|---|---|---|
| 2016/0084651 A1 | 3/2016 | Hinderling et al. | |
| 2016/0131745 A1* | 5/2016 | Nordenfelt | G02B 26/12 356/4.01 |
| 2017/0285144 A1* | 10/2017 | Kiryuu | G01S 7/4865 |
| 2017/0356741 A1* | 12/2017 | Nishita | G01S 17/87 |

FOREIGN PATENT DOCUMENTS

| | | | |
|---|---|---|---|
| EP | 1 832 897 B1 | 11/2010 | |
| EP | 3077768 A2 | 10/2016 | |
| EP | 3 098 564 A1 | 11/2016 | |
| EP | 3077768 B1 * | 1/2020 | G01S 7/4811 |

\* cited by examiner

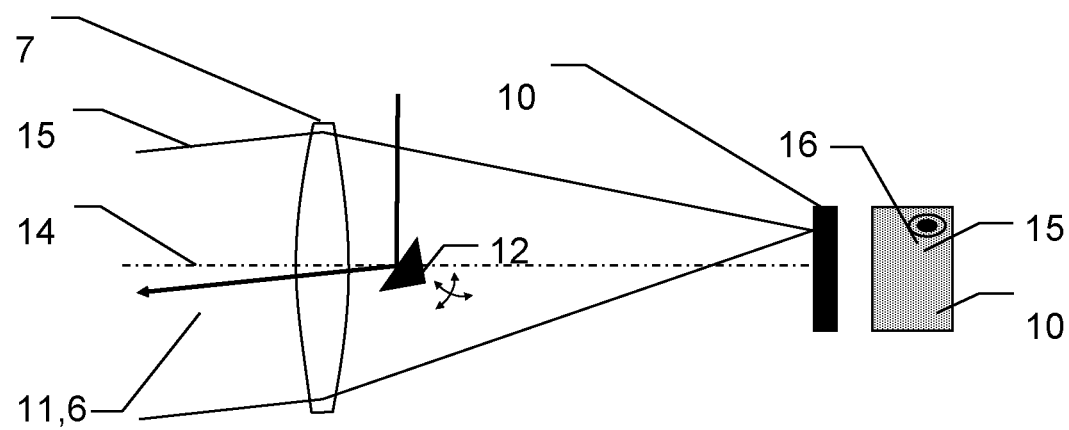
Fig.2a
Fig.2b
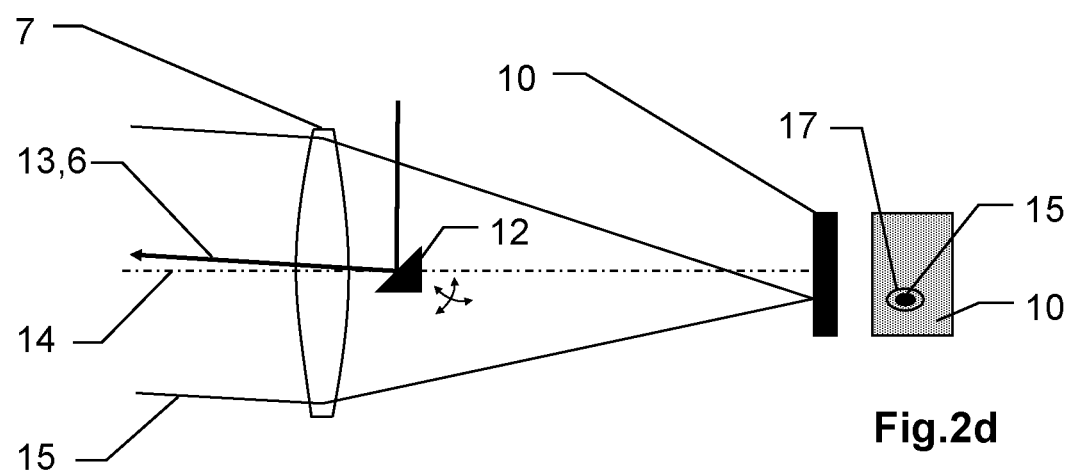
Fig.2c
Fig.2d

TOTAL STATION OR THEODOLITE HAVING SCANNING FUNCTIONALITY AND SETTABLE RECEIVING RANGES OF THE RECEIVER

FIELD

The present disclosure relates to a total station or a theodolite having scanning functionality for optically surveying an environment.

BACKGROUND

Total stations or theodolites having scanning functionality are used, for example, to measure and/or create 3D coordinates of surfaces. For this purpose, they have to be capable of guiding the measuring beam—usually a laser beam—of a distance measuring device over a surface and thus simultaneously acquiring direction and distance to the respective measurement point in various measurement directions successively at a predefined scanning or measuring rate. Direction and distance are in relation to a measurement reference point in this case, for example, the location or zero point of the surveying device, in other words, they are located in a common reference or coordinate system, and therefore the individual measurement directions and thus the individual measurement data are linked to one another via the common measurement reference point. Subsequently, for example, by means of an integrated or external data processing system, a so-called 3D point cloud can therefore be generated from the plurality of the scanned points from the distance measured value and the measurement direction correlated therewith for each point.

With respect to the fundamental structure, such total stations or theodolites are designed, for example, having an electro-optical laser-based distance meter, in order to acquire a distance to an object point as a measured point, wherein moreover a directional functionality is provided in order to vary the transmission direction of the distance measuring beam, for example, with respect to one or more independent spatial directions, whereby a three-dimensional measuring or scanning region can be acquired.

Various principles and methods are known in the field of electronic and/or electrooptical distance measurement. One approach is to emit pulsed electromagnetic radiation, for example, laser light, onto a target to be surveyed and subsequently to receive an echo from this target as a backscattering object, wherein the distance to the target to be surveyed can be determined, for example, on the basis of the runtime, the shape, and/or the phase of the pulse. Such laser distance meters have become established in the meantime in many fields as standard solutions.

Usually, two different approaches or a combination thereof are used for detecting the backscattered pulse or a backscattered pulse sequence.

In the so-called threshold value method, a light pulse is detected if the intensity of the radiation incident on a detector of the distance measuring device used exceeds a certain threshold value. This threshold value prevents noise and interfering signals from the background from being detected incorrectly as a useful signal, i.e., as backscattered light of the emitted pulse.

However, it is problematic that in the case of weak backscattered pulses, for example, as are caused by greater measurement distances, a detection is no longer possible if the pulse intensity falls below the detection threshold, i.e., below the threshold value. The essential disadvantage of this threshold value method is therefore that the amplitude of the measurement signal has to be sufficiently greater than the noise amplitude of optical and electrical noise sources in the signal path, in order to minimize false detections sufficiently, and therefore the threshold value method only has limited usability for measurements at relatively great distances.

The other approach is based on the scanning or sampling of the backscattered pulse. This approach is typically used in the case of weak backscattered signals (for example, pulse signals), as are caused, for example, due to greater measurement distances. This method can also be considered to be integrated signal acquisition, wherein both the overall signal information and also the essential noise information are acquired by the sampling, which results in an enhancement of the measurement accuracy. An emitted signal is detected by the radiation acquired by a detector being sampled, a signal being identified within the sampled range, and finally a location of the signal being chronologically determined. Due to the use of a plurality of sampled values and/or summation of the reception signal synchronized with the emission rate, a useful signal can be identified even under unfavorable circumstances, and therefore greater distances or background scenarios which are noisy or subject to interference can also be managed.

SUMMARY

Presently, in this case the entire waveform of the analog signal of the radiation acquired by a detector is frequently sampled by means of the waveform digitization method ("waveform digitizing", WFD). After identification of the coding of the associated emitted signal (ASK, FSK, PSK, also called distance or interval modulation, etc.) of a reception signal, for example, a signal runtime ("pulse runtime") is determined very accurately by means of Fourier transform or from a defined curve point of the sampled, digitized, and reconstructed signal, for example, the inflection points, the curve maxima, or integrally by means of an optimum filter known from time interpolation.

Alternatively or additionally to the determination of the pulse runtime, a (rapid) sampling often also takes place with respect to amplitude, phase, polarization, wavelength, and/or frequency of coded or modulated pulses or pulse sequences.

For example, in the case of the approach of the chronologically very precise sampling of the backscattered signal, the electrical signal generated by the detector is converted by means of an analog-to-digital converter (ADC) into a digital signal sequence. This digital signal is subsequently further processed, usually in real time. In a first step, this signal sequence is decoded by special digital filters (ASK, FSK, PSK, etc.), i.e., recognized, and finally the location of a signature describing a time interval within the signal sequence is determined. Examples of time-resolving signatures are focal point, cosine transform, or, for example, amplitude-scaled FIR filter ("finite impulse response filter") comprising a weight coefficient set derived from the pulse shape. To eliminate possible distance drifts, a corresponding time-resolving signature is also compared to an internal starting signal. To avoid irreversible sampling errors or quantification errors, digital signal transformations known to a person skilled in the art are additionally applied.

One of the simplest types of modulation is the identification of the individual pulses or the pulse sequences via interval coding as described, for example, in EP 1 832 897 B1. This is used for the purpose of reidentification ability, for example. This reidentification is required if an ambiguity arises, which can be induced by different situations in the runtime measurement of pulses, for example, if more than one pulse or one pulse group is located between surveying device and target object. The pulse coding is advantageous in particular, for example, in multibeam systems consisting of multiple laser beams and associated receiving sensors.

A total station from some systems have, for example, a base and a support, wherein the support is fastened on the base so it is rotatable about a first axis of rotation. Furthermore the total station has, for example, a carrier, which is fastened on the support so it is rotatable about a second axis of rotation, which is substantially orthogonal to the first axis of rotation, wherein the carrier has an optical distance meter for measuring a distance to the target by means of a distance measuring beam. The carrier furthermore has, for example, a common entry and exit optical unit for the emitted distance measuring beam (transmitted beam) and associated returning parts of the distance measuring beam (received beam). Alternatively, the carrier can also have a separate entry optical unit and a separate exit optical unit.

For the two-dimensional alignment of the distance measuring beam on a target, typically both the support and also the carrier are moved, wherein for a special surveying task, at least one movement of the support or the carrier is necessary for each measurement procedure, for example. Support and carrier are often comparatively heavy and thus sluggish components, because of which the scanning speed is accordingly limited in the scope of a surveying task.

To elevate the scanning rate, the carrier therefore has, for example, an additional rapid deflection element, for rapid deflection of the outgoing distance measuring beam in relation to the carrier. Therefore, a rapid movement of the beam bundle of the distance measuring beam required for the measurement can thus be effectuated within the acquisition region of the entry optical unit, without requiring for this purpose the movement of the larger (sluggish) components otherwise required. However, support, carrier, and the additional rapid deflection element (or multiple additional rapid deflection elements) can also be moved simultaneously and with different speeds, accelerations, and path curves, wherein, for example, the rapid movements subject to acceleration are executed using the at least one rapid deflection element.

The rapid deflection element can be implemented in the form of a moving mirror or alternatively also by other elements suitable for the controlled angle deflection of optical radiation, for example, pivotable prisms, moving optical waveguides, light-refracting optical elements, deformable optical components, etc. The measurement usually takes place with determination of distance and angles, i.e., in spherical coordinates, which can also be transformed into Cartesian coordinates for the display and further processing.

The beam paths for the transmitted and received radiation can be designed such that the deflection unit only acts on the transmitted radiation i.e., the imaging effect of the receiving channel is substantially independent of the actuation of a deflection element, the transmitting channel and the receiving channel each have a separate, for example, separately actuable deflection unit, or a single deflection unit acts both on the transmitted radiation and also on the received radiation.

If the deflection unit only acts on the transmitted radiation, this has the disadvantage, for example, that due to the varying angle of incidence of the received beam, the imaging position of the received radiation on the receiver varies and therefore a larger receiver surface is necessary than if, for example, the imaging position is stabilized by means of a corresponding optical unit. However, the background light component is also elevated by the larger receiver surface, which can result in a worsened signal-to-noise ratio as a result of shot noise, for example.

The background light component can be reduced, for example, by a suitable selection of the wavelength of the transmitted radiation and the installation of corresponding filters in the reception path. However, this typically elevates the complexity of the light source, since it has to have a defined and stable wavelength. This is complex, requires special stabilization measures, and at the same time also prevents, for example, a more compact construction of the surveying device.

In particular for measuring tasks where larger spatial angle ranges are to be scanned, the at least one or the multiple additional rapid deflection elements are suitable for expanding the field of view or filling angle ranges between the paths of the sluggish movement axes with further points. Dense point clouds can thus be generated at high speed. The rapid deflection element, or multiple rapid deflection elements, respectively, is/are therefore often arranged such that one common deflection element is installed for receiving and transmitting channels or two separate beam deflection elements are installed for transmitting and receiving channels.

To keep the receiver small and thus in turn reduce, for example, the background light component, various methods are known in some systems, for example, based on optical tracking of the receiving channel. Optical tracking is known in scanner applications, since in the case of large distances and/or rapid scanning movements, the alignment of the device moves further between the point in time of the emission of the measuring beam and the reception of the light reflected at the object. If angle tracking of the receiver alignment were omitted, a receiver having larger surface would thus have to be used. However, the individual solutions always require a compromise with respect to device parameters, for example, device size, system complexity, deflection speed, measurement accuracy, measurable distance range, or flexibility with respect to settable scanning patterns.

One object of the present disclosure is to provide a total station or a theodolite, whereby the disadvantages known from some systems are avoided, in particular wherein rapid and precise measurements are enabled over an extended distance measurement range.

This object is achieved by the implementation of the characterizing features of the independent claims. Features which refine the present disclosure in an alternative or advantageous manner can be inferred from the dependent patent claims.

Some embodiments of the present disclosure relate to a total station or a theodolite for acquiring a position of a target, having a radiation source for generating a transmitted radiation, for example, pulsed laser measuring radiation, a base, a support, which is fastened on the base so it is rotatable about a first axis of rotation, and a carrier, which is fastened on the support so it is rotatable about a second axis of rotation, which is substantially orthogonal to the first axis of rotation. In this case, the carrier has an exit optical unit for emitting a distance measuring beam, which is provided by at least a part of the transmitted radiation and defines a targeting axis, and a settable beam deflection element, which is configured to deflect the distance measuring beam such that the targeting axis is variable in a defined manner in relation to the carrier, and a receiver comprising an overall detector surface, wherein the receiver is configured to acquire distance measurement data based on at least a part of the returning distance measuring beam incident on the receiver, referred to as received radiation hereafter. The total station or the theodolite moreover has a support angle encoder for acquiring first angle data with respect to a rotation of the support about the first axis of rotation and a carrier angle encoder for acquiring second angle data with respect to a rotation of the carrier about the second axis of rotation. Furthermore, the total station or the theodolite has an angle determining unit for acquiring third angle data with respect to the alignment of the targeting axis in relation to the carrier, and a computer unit, which is configured to derive the position of the target based on the distance measurement data and the first, the second, and the third angle data.

According to some embodiments of the present disclosure, the total station or the theodolite is configured such that a setting of a section of the overall detector surface as an active acquisition region takes place, wherein the active acquisition region is settable in a chronologically variable manner with respect to its position on the overall detector surface, in particular wherein the active acquisition region is furthermore settable in its shape and/or in its dimensions, and wherein a receiver signal dependent on the setting of the active acquisition region is generated by received radiation incident on the overall detector surface. Furthermore, the total station or the theodolite has a control electronics unit, wherein the control electronics unit is configured for the ongoing setting of the active acquisition region, adapted to the actuation of the beam deflection element, and for deriving the distance measurement data based on the receiver signal.

According to one embodiment, the receiver has a radiation-opaque blocking element for the received radiation on the received radiation side, wherein the blocking element is configured such that a chronologically variable settable transmission region is adjusted for the transmission of the received radiation to the overall detector surface, wherein the position of the transmission region is settable with respect to the overall detector surface, in particular wherein the transmission region is furthermore settable with respect to its shape and/or its dimensions.

For example, the blocking element can be designed based on a settable rotatable disk, which is arranged substantially parallel to the overall detector surface, made of radiation-opaque material for the received radiation, which has a radiation-transmissive opening for the received radiation. For example, the openings and the rotational velocities of two interlocking disks can be designed or adjusted, respectively, such that the active acquisition region is respectively settable such that different acquisition regions define a two-dimensional virtual movement over the detector surface.

The receiver can be designed, for example, as a large-area photodiode, wherein according to some embodiments of the present disclosure the effective detection surface of the photodiode is respectively restricted by means of the blocking element to substantially the lateral cross section of the distance measuring beam imaged on the overall detector surface. According to some embodiments of present disclosure, the respective location, which is dependent on the transmission direction of the distance measuring beam, of the received radiation imaged on the photodiode is thus taken into consideration and interfering ambient light (lateral to the received beam) is suppressed.

The location and/or shape of the received beam imaged on the overall detector surface can furthermore be dependent on the distance to the target, for example, if a fixed-focus optical unit is used in the receiving channel of the total station or the theodolite.

In particular, the control electronics unit is therefore configured to synchronize the actuation of the beam deflection element and the setting of the active acquisition region based on at least one of the following: the third angle data, a distance to the target, and a signal runtime to the target.

Alternatively or additionally to an above-described mechanical blocking of the (lateral) ambient light, according to a further embodiment, the receiver can furthermore have an optoelectronic sensor based on an assembly of microcells, in particular wherein the sensor is designed as an assembly of single-photon avalanche photodiodes, wherein the sensor has a plurality of microcells and is configured such that the microcells can be read out individually and/or in microcell groups and sections of the receiver which can be read out individually are thus settable, and wherein the control electronics unit is configured for the ongoing setting of different sections which each define the active acquisition region.

The sensor can be, for example, an assembly of single-photon avalanche photodiodes. Assemblies of single-photon avalanche photodiodes, also called SPAD assembly or SPAD arrays, are generally arranged as a matrix structure on a chip. The assemblies or chips having a photosensitivity in the visible and near-infrared spectral range are also referred to as SiPM (silicon photomultiplier). The SiPM are gradually replacing the previously used photomultiplier tubes, in particular in the visible and near-ultraviolet spectral range. SiPM have a high spectral sensitivity in the visible wavelength range. For example, SPAD arrays are available in some systems, which are sensitive up into the near-infrared range, up to well over 900 nm wavelength.

The special feature of these SPAD arrays is the high amplification thereof, because of which these have heretofore been used in the case of very weak optical signals, where only 1 to 50 photons are incident on the sensor. Such sensors, which are airborne, for example, are also referred to as SPL-lidar (SPL="single-photon lidar"). However, with only a few photons, the distance noise is substantial and is typically 10 mm to 100 mm. Moreover, the absolute distance measurement accuracy is influenced by the signal strength, in particular in SPAD arrays having few microcells. In contrast, a distance noise of much less than 1 mm can be achieved by special measures, for example, a range walk compensation, whereby a measurement accuracy of 0.1 mm is achieved. This corresponds to a typical time resolution of one picosecond or less.

Commercial SPAD arrays are also available at wavelengths between 800 nm and 1800 nm. These sensors primarily consist of the semiconductor material InGaAs. These sensors also have an external or internal matrix structure above the photosensitive surface depending on the design. Distance measuring systems comprising SPAD arrays in this spectral range have the advantage that the solar ambient light (daylight) is significantly lower in relation to the visible wavelength range and this interfering luminous flux thus interferes less with the SPAD arrays.

The special feature of these SPAD array sensors is the very high photosensitivity, wherein the SPAD arrays are primarily designed for the purpose of being able to detect individual photons correctly. They are therefore also referred to as "multi-pixel photon counters" (MPPC). The SPAD arrays consist of hundreds, thousands, or up to more than tens of thousands microcells and are thus capable of receiving pulses having thousands or hundreds of thousands of photons simultaneously. Moreover, because of the parallel connection of the many microcells into cell groups (domains), sufficient free cells for the signal photons are still present in the event of solar background light.

A further special feature of SPAD assemblies is in particular that individual microcells or individual subsets of microcells can be actuated separately and/or read out separately. The microcells can thus be sequentially actuated locally, for example, for a line-by-line or column-by-column read-out of the receiver (for example, as a "rolling shutter" or "rolling frame"). In particular, sections of the receiver which can be read out individually depending on the transmission direction can thus be defined.

For example, the sections can be defined such that they each represent a spatial sequence of adjacent microcells, for example, wherein each section corresponds to at least one line or at least one column of the SPAD assembly. The sections can also be defined by respective spaced-apart regions of the receiver, however, i.e., the individual sections do not represent a coherent sequence of microcells.

In particular, the individual sections can be defined such that they at least partially mutually overlap.

For example, the sections can furthermore be adapted to one another such that, by a sequence of signal acquisitions by individual sections (domains), for example, individual microcells or microcell groups of the SPAD assembly are read out alternately, for example, alternately even and odd cells (with respect to the SPAD assembly) within the sections. Such a chronologically alternating activation of microcells or microcell groups results, for example, in a shortening of the recovery time of the SPAD array, whereby a more rapid laser modulation or firing rate is possible.

Instead of separately activating the microcells or microcell groups (domains) of the SPAD assembly, they can remain activated in a stationary state, for example, in order to acquire and analyze the outputs of the microcells or microcell groups (domains) synchronously with the transmitter-side scanning movement for the "rolling shutter" or "moving frame" function. In this case, by means of an electronic circuit integrated on the SPAD array, for example, in particular those microcells or microcell groups (domains) are connected to the signal output which are aligned synchronously in time toward the surface of the object, which is irradiated by the transmitter-side laser. If the scanning movement of the laser moves in the vertical direction, the effective receiver-side domain shifts synchronously in the same direction, and therefore the field of view (FoV, "field-of-view") of the active receiving unit can receive the laser spots on the object in a timely manner. The respectively active field-of-view of the receiving unit is for example designed sufficiently small in the angle range that the backscattered received pulses can be completely seen and received and at the same time as little interfering ambient light is received as possible. The restriction of the field of view and thus the minimization of the number of the activated microcells moreover also reduces the noise contributions of thermally and capacitively caused noise sources.

In contrast to the comparatively costly photomultiplier tubes having large time jitter, the modern SiPM sensors are cost-effective and have time jitter in the picosecond to subpicosecond range. Moreover, the SiPM arrays are manufactured by means of a conventional CMOS technology process, which additionally enables the integration of electronic components and circuits. This applies accordingly to the SPAD arrays made of the semiconductor material InGaAs.

The high photosensitivity is to be attributed to the avalanche mechanism, wherein the individual microcells of the array are operated, for example, in the overvoltage range ("reverse voltage beyond the break voltage"), i.e., beyond the breakthrough voltage (break voltage), at which a single photon triggers an avalanche of electrons, whereby the signal is strongly amplified depending on the setting, for example, an amplification up to a factor of one million. The current associated with the photon is easy to convert into a voltage signal and supply to a signal analysis unit without substantial amplification because of its strength.

An SPAD array is capable of receiving multiple photons simultaneously, wherein the currents of the many microcells on the sensor chip can be added and subsequently converted, for example, via a resistor or a trans-impedance amplifier into a voltage signal. The SPAD array can be configured, for example, such that, for example, having more than 10,000 microcells, it behaves like an analog photosensor, wherein the characteristic curve is approximately proportional to the intensity of the incident laser pulse, for example, in the case of weak reception signals.

The literature differentiates between SPAD array operations in the linear mode, Geiger mode, and SPL mode (SPL, "single-photon lidar").

In the linear mode below the breakthrough voltage, an amplification dependent on reverse voltage and temperature occurs and SPAD arrays can be used, for example, to construct high-sensitivity photoreceivers having output voltage proportional to the radiant power.

In the Geiger mode and SPL mode, i.e., in each case in operation above the breakthrough voltage, SPADs and SPAD arrays can be used for single photon counting. In the SPADs, each individual pixel generates an output signal in the Geiger mode, wherein the electron avalanche is triggered by precisely one photon. If a photon packet made of multiple photons is incident, a greater signal is not measured, therefore no amplitude information is provided.

In the Geiger mode, an incident photon packet merely generates a (binary) event signal, which is not proportional to the number of photons in the photon packet.

SPL mode is understood as an SPAD array operated in the Geiger mode, where many microcells are connected in parallel to form an output signal. In the event of incident photon packets having only a few photons, the individual avalanches add up practically linearly and the amplitude of the output signal is therefore proportional to the number of acquired photons.

In the case of laser distance measurement at different distances and on varying surfaces, the number of the photons can vary, for example, from fewer than 10 to greater than 109. SPAD arrays, in contrast, have a compression factor of the measured signal amplitude which is at least 104, typically 108 in relation to the actual signal amplitude. It is therefore possible to measure both on black diffuse targets and also on retroreflectors using SPAD arrays, without the receiving unit requiring a signal regulation. Due to the large amplification, SPAD arrays moreover have, for example, a low noise and SPAD arrays having high filling factor display a signal-to-noise ratio (SNR) suitable for distance measurements. The more microcells an SPAD array has, the greater is the SNR.

A pulse coding is generally applied to the laser signals of a distance meter. Typical pulse rates are between kilohertz to gigahertz. Experiments have shown that such signals can be received well with SPAD arrays at voltages in overbreak operation. Pulse packets (bursts) can also be received unambiguously and nearly without noise using SPAD arrays. This is also the case, for example, if the recovery time of the microcells is quite long at 10 ns. Because of the quasi-analog structure of SPAD arrays, a photocurrent present due to ambient light, for example, can also be received. The laser signal is then overlaid on the electrical photocurrent of the ambient light. For example, the current surge generated by the laser pulse at the output of the SPAD array is high-pass filtered, so that the slow rear signal flank is shortened. The output pulse thus becomes a short signal pulse, for example, having a pulse duration less than one nanosecond. Such short pulses having steep flanks are suitable for precise time measurement and therefore also distance measurement. The use of a high-pass filter (differentiator) has no influence on the recovery time of the SPAD array, however.

Furthermore, first implementation experiments have already been undertaken to integrate more electronic functionality into the SPAD arrays. For example, time measuring circuits ("TOF circuitries") have already been associated with each microcell. These measure the runtime (TOF, "time-of-flight"). SPAD array implementations exist, for example, wherein a precise photon counter is integrated close to the microcells, which manages without a downstream analog-to-digital converter (ADC). Moreover, for example, a time measuring circuit (TDC, "time to digital converter") can be integrated in each microcell. Furthermore, a digital interface is used as the output of the SPAD array, for example. Such building blocks are completely digital and do not require "mixed signal processing" in the CMOS production.

According to some embodiments of the present disclosure, direction-dependent sections of the receiver are thus set depending on the transmission direction of the transmitted radiation, in order to adapt the active receiver surface mechanically and/or electronically to a varying imaging position of the received radiation on the overall detector surface. The respective used receiver surface can thus be optimized with respect to the incident received beam. For example, the active receiver surface can be substantially adapted to the beam diameter of the respective received beam. The background light component can therefore be kept low for each individual measurement even with a receiver which is overdimensioned with respect to the beam diameter.

According to a further embodiment of the present disclosure, the control electronics unit is configured to control the total station or the theodolite based on a preprogrammed measuring procedure, wherein an in particular sweeping scanning is carried out by means of the distance measuring beam by the measuring procedure and the measuring procedure has a first and a second step, wherein the first step defines a movement of the support about the first axis of rotation and/or a movement of the carrier about the second axis of rotation, and the second step defines the actuation of the beam deflection element and thus a movement of the distance measuring beam in relation to the carrier. The second step is overlaid on the first step in this case, wherein the movement of the distance measuring beam takes place at a higher speed in comparison to the movements of the support and the carrier, and different active acquisition regions are each set based on the third angle data, and therefore active acquisition regions set at respective different points in time are each aligned in the direction of the respective distance measuring beam imaged in a timely manner on the target. If an optoelectronic sensor according to the present disclosure is used, for example, only the respective set section of the sensor which can be individually read out can be connected to the signal output of the sensor at the respective different points in time.

The active acquisition regions are especially respectively set in such a manner that the respective (effective) field of view of the receiver defined by an active acquisition region encompasses the distance measuring beam imaged on the receiver such that the ratio between the area of the distance measuring beam imaged on the respective active acquisition region to the area of the respective active acquisition region is greater than a defined threshold value.

The transmitter-side beam deflection element for deflecting the distance measuring beam can be implemented, for example, as a moving mirror or alternatively also by way of other elements suitable for the controlled angle deflection of optical radiation, for example, pivotable prisms, movable optical waveguides, light-refractive optical elements, acoustooptical modulators, electrooptical deflectors, deformable optical components, etc.

According to some embodiments of present disclosure, on the receiver side, for example, the (effective) field-of-vision of the receiving unit is thus tracked synchronized with the second step. This measure takes place, for example, in that at a certain point in time, only one domain (subgroup of microcells) of a SPAD array is connected to the signal output, which is aligned accurately in the direction of the light spot on the object/target. Since the light spots are pivoted in a scanning manner over the object to be surveyed, the active domain of the SPAD array is pivoted synchronously over the object solely by circuitry. This active domain of the SPAD array forms the active field of view of the receiving unit. This respective active field of view of the receiving unit is intentionally designed narrow, so that as little sunlight as possible is collected and as few microcells as possible of the active domain are incorrectly triggered. The activated sections of the receiver move synchronously with the light spot over the surface of the SPAD array, in such a way that the active microcells partially or entirely encompass the light spot. Due to this electronic scanning, also called "solid-state scanning", no moving parts, for example, MEMS scanner, wedge scanner, polygon prism wheel, or polygon mirror wheel, are required on the reception side.

According to a further embodiment, the carrier has an optical receiving channel for imaging the received radiation on the receiver, wherein the receiving channel is configured such that the imaging effect of the receiving channel is substantially independent of the actuation of the beam deflection element, in particular wherein the beam deflection element is arranged such that it only acts on the transmitted radiation. This thus means that the receiving channel has a static optical axis in relation to the carrier, i.e., no optical direction correction of the incident received beam takes place. Thus, for example, the optical expenditure and the mechanism of the receiving channel can be simplified, in particular also because of the large bundle diameters and the steep angles of the edge beams in the receiving channel.

In a further embodiment, the beam deflection element is configured such that the deflection of the distance measuring beam takes place in such a manner that the distance measuring beam is solely deflected with respect to two different deflection directions, which are orthogonal to one another in particular, in relation to the carrier.

Furthermore, it is often sufficient for surveying tasks of a total station if rapid scanning only takes place along a single scanning direction. This thus also enables a simplified and possibly more compact construction of the transmitting and receiving channel.

A further embodiment is therefore characterized in that the beam deflection element is configured such that the deflection of the distance measuring beam takes place in such a manner that the distance measuring beam is only deflected with respect to a single deflection direction in relation to the carrier, whereby a (present) scanning plane containing the distance measuring beam is defined with respect to the carrier.

According to a further embodiment, the overall detector surface can thus, for example, have an oblong, in particular rectangular shape, whereby a long and a short receiver axis are defined, wherein the receiving channel is configured such that the scanning plane is imaged on the overall detector surface along the long receiver axis.

The angle data with respect to the alignment of the target axis are derived by the control electronics unit, for example, on the basis of control signals for the actuation of the beam deflection element and/or based on angle measurement data, which are provided, for example, by one or more angle meters provided in the total station or the theodolite.

According to a further embodiment, which has at least one above-described optoelectronic sensor comprising a plurality of microcells which can be read out individually and/or in microcell groups, the total station or the theodolite is configured to derive a position of incidence of the received radiation on the receiver, in particular by means of focal point determination or maximum determination of the acquired received radiation, and to derive an item of correction information with respect to the third angle data based on the position of incidence and the distance measurement data.

For example, an accurate referencing of distance measurement data for a creation of a point cloud can thus be achieved, wherein, for example, additional angle meters, which are associated with the beam deflection element, in the measuring device can be omitted. For example, it can therefore be sufficient under certain circumstances if the (initially) derived angle data are only based on control signals for the actuation of the beam deflection element and the initially derived angle data are corrected based on the position of incidence for the referencing in a point cloud.

In a further embodiment, the total station or the theodolite is configured in order to estimate a first item of imaging information for a beam shape and/or location of the received radiation imaged on the receiver based on third angle data, in particular based on a defined fixed-focus optical unit, wherein the active acquisition region is set based on the estimated first item of imaging information.

For example, for this purpose the total station or the theodolite can be configured to derive, based on the third angle data, an angle of incidence of the received radiation with respect to the receiving channel of the total station or the theodolite, wherein the first item of imaging information is derived from the angle of incidence.

According to a further embodiment, the total station or the theodolite is configured to estimate, based on a distance to the target, a second item of imaging information for a beam shape and/or location of the received radiation imaged on the receiver, wherein the active acquisition region is set based on the estimated second item of imaging information. Thus, for example, in the case of measurements at short distances, near field corrections and near field effects of the receiving optical unit can be taken into consideration.

In particular, according to a further embodiment, which has at least one above-described optoelectronic sensor comprising a plurality of microcells which can be read out individually and/or in microcell groups, the total station or the theodolite can be configured to estimate, based on feedback of the receiver with respect to previously acquired received radiation, a third item of imaging information for a beam shape and/or location of the received radiation imaged on the receiver, wherein the section defining the active acquisition region is set based on the estimated third item of imaging information.

Furthermore, according to a further embodiment, the receiver can have multiple sensors, wherein the multiple sensors are arranged one-dimensionally or two-dimensionally in relation to one another, in particular wherein each of the sensors has a separate actuation electronics unit and/or analysis electronics unit. In such assemblies of sensors, for example, SPAD arrays, the individual arrays are often referred to as pixels, although each of these pixels itself consists of hundreds to tens of thousands of microcells.

Furthermore, the receiver, which has at least one above-described optoelectronic sensor comprising a plurality of microcells which can be read out individually and/or in microcell groups, is designed according to a further embodiment such that a set of sections which can be read out chronologically in parallel is definable, in particular wherein the radiation source is configured to generate a bundle of differently oriented and/or spaced-apart laser measuring beams generated in parallel, wherein the sections of the set of sections which can be read out chronologically in parallel are defined in this case such that they are each associated with one laser measuring beam of the bundle of laser measuring beams. Thus, for example, multibeam sampling can take place using multiple parallel and/or divergent laser measuring beams.

BRIEF DESCRIPTION OF THE DRAWINGS

The total station according to the present disclosure or the theodolite according to the present disclosure are described in greater detail hereafter, solely by way of example, on the basis of exemplary embodiments which are schematically illustrated in the drawings. Identical elements are identified in the figures with identical reference signs. The described embodiments are generally not shown to scale and they are also not to be understood as a restriction.

In the specific figures:

FIGS. 2a-d: show a schematic illustration of a beam path of a use according to some embodiments of present disclosure of an SPAD array as a photosensitive surface of a receiver in a total station or a theodolite;

DESCRIPTION OF EMBODIMENTS

Figure 1:
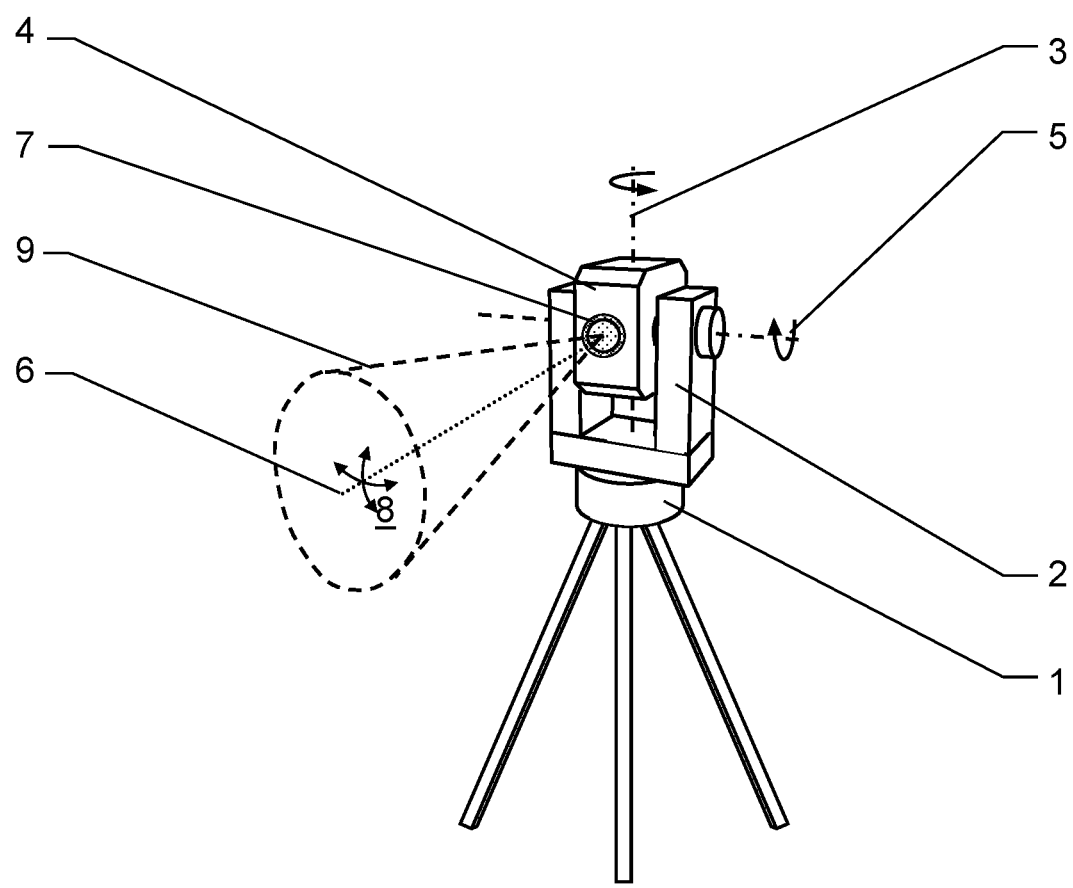
FIG. 1: shows a total station according to some embodiments of the present disclosure having an additional deflection of the distance measuring beam in relation to the carrier.

FIG. 1 shows a total station according to the present disclosure having an additional deflection of the distance measuring beam in relation to the carrier.

The total station has, for example, a base 1 and a support 2, wherein the support 2 is fastened on the base 1 so it is rotatable about a first axis of rotation 3. Furthermore, the total station has a carrier 4, which is fastened on the support 2 so it is rotatable about a second axis of rotation 5, which is substantially orthogonal to the first axis of rotation 3, wherein the carrier 4 has an optical distance meter for measuring a distance to the target by means of a distance measuring beam 6. The carrier 4 furthermore has, for example, a common entry and exit optical unit 7 for the emitted distance measuring beam 6 (transmitted beam) and associated returning parts of the distance measuring beam (received beam). Alternatively, the carrier can also have a separate entry optical unit and a separate exit optical unit.

Total stations typically furthermore have directional means (not shown) for aligning the targeting axis of the total station on a target, for example, an ocular, a camera having telescopic lens, or an automatic target acquisition unit. Furthermore, total stations can be designed for automatic target tracking, for example, wherein a target is actively illuminated by emitted tracking radiation and is identified and tracked on the basis of the returning radiation, for example, by means of acquisition of the offset of the acquired tracking beam on a position-sensitive diode.

Both the support 2 and also the carrier 4 are moved for the two-dimensional alignment of the distance measuring beam 6 on a target, wherein at least one movement of the support 2 or the carrier 4 is necessary, for example, for each measurement procedure for a special surveying task. Support 2 and carrier 4 are often comparatively heavy and thus sluggish components, because of which the scanning speed in the scope of a surveying task is accordingly limited.

To elevate the scanning rate, the carrier 4 therefore has, for example, an additional rapid deflection element with respect to speed and acceleration, for rapid deflection 8 of the outgoing distance measuring beam 6 in relation to the carrier 4. Therefore, a rapid movement of the beam bundle of the distance measuring beam 6 required for the measurement can thus be effectuated within the field of view 9 of the receiving optical unit, which is substantially defined by the entry optical unit 7, without requiring for this purpose the movement of the larger (sluggish) components otherwise necessary.

Points outside the field of view of the receiving optical unit are acquired by means of a combined movement sequence. The slow or sluggish movements with low acceleration take place by means of movement of the support 2 and the carrier 4, whereas the rapid movements with high speed and acceleration take place on the transmitter side using at least one rapid additional deflection element in the carrier 4.

According to some embodiments of the present disclosure, the receiver of the distance meter is designed, for example, based on an SPAD array, wherein the actuation of the additional rapid deflection element in the carrier 4 and the acquisition of the distance measurement data are synchronized such that, based on the transmission direction of the distance measuring radiation 6 (transmitted radiation), the received radiation is acquired based on a defined section of the receiver. Depending on the transmission direction of the transmitted radiation 6, direction-dependent sections of the receiver are thus defined, to adapt the active receiver surface to a varying imaging position of the received radiation. The respective used receiver surface can thus be optimized with respect to the incident received beam. For example, the active receiver surface can be substantially adapted to the beam diameter (with respect to the light spot imaged on the receiver) of the respective received beam, whereby the background light component can also be kept low for each individual measurement using a receiver which is overdimensioned per se with respect to the beam diameter.

FIGS. 2a to 2d schematically show a use according to some embodiments of the present disclosure of an SPAD array 10 as a photosensitive surface of a receiver. FIGS. 2a, 2b relate in this case to a first transmission direction 11, set by a deflection element 12, which substantially acts only on the transmitted radiation 6, and FIGS. 2c, 2d relate to a second transmission direction 13, set by the deflection element 12. The optical axis of the receiving channel is thus substantially static in relation to the carrier.

FIG. 2a shows a side view of a simplified optical path for the first transmission direction 11, comprising a main axis 14 of a common exit/entry optical unit 7 and a receiver having an SPAD array 10. The deflection element 12 can deflect the transmitted radiation 6 one-dimensionally or two-dimensionally in particular here, i.e., along a first and/or second deflection direction. Furthermore, it is clear to a person skilled in the art that depending on the type of the beam deflection element 12 used, for example, mirror element, prism, polygon wheel, double wedge, refractive element, movable optical waveguide, or MOEMS component, and operating principle of the radiation deflection thus effectuated, for example, displacement/tilting of the deflection element or electro-optical actuation of optical (for example, refractive) properties of the deflection element, it can be arranged both in a parallel and also in a divergent beam path.

FIG. 2b shows a top view of the receiver, or the SPAD array 10, respectively, from FIG. 2a. According to some embodiments of the present disclosure, the SPAD array 10 has a plurality of microcells and is configured such that the microcells can be read out individually and/or in microcell groups (domains) and sections of the SPAD array 10 which can be read out individually are thus definable. The actuation of the deflection element 12 and the acquisition of the received beam 15 are synchronized in this case such that, based on the transmission direction, the first transmission direction 11 here, the received beam 15 is detected based on a defined section of the SPAD array 10, a first section 16 here.

In a similar manner, FIGS. 2c (side view) and 2d (top view) show the optical path with respect to the second transmission direction 13, wherein a second section 17 for the acquisition of the received beam 15 is defined based on the second transmission direction 13.

In particular, the respective defined sections 16, 17 can each be optimized with respect to the beam shape of the incident received beam 15. For example, the area of the section can be substantially adapted to the beam diameter of the respective received beam 15, wherein, for example, changes of the light spot size are taken into consideration on the basis of receiver-side apertures and a fixed-focus optical unit. The background light component can therefore also be kept low for each individual measurement using a receiver which is overdimensioned per se with respect to the beam diameter.

Figure 3A:
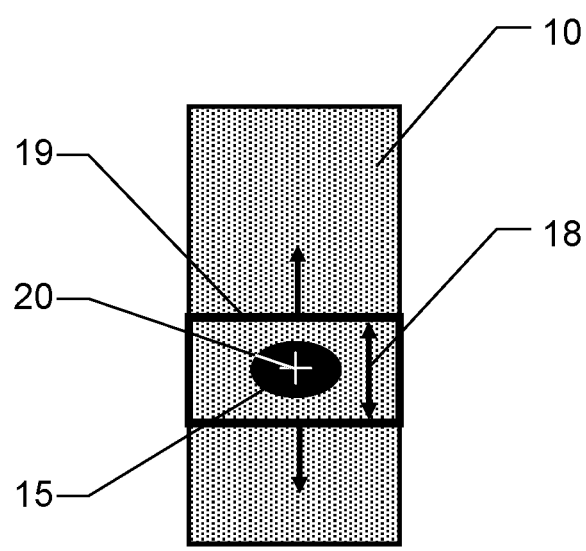
FIGS. 3a,b: show an embodiment according to the present disclosure ("rolling shutter window") with respect to the definition of the individual sections of an SPAD assembly dependent on the transmission direction, for example, a) one-dimensional, b) two-dimensional.

FIG. 3a shows a further embodiment according to the present disclosure, which has at least one above-described optoelectronic sensor comprising a plurality of microcells which can be read out individually and/or in microcell groups, for example, an SPAD array 10. The sections are defined here similarly to a so-called "rolling shutter" or "moving frame" principle, i.e., the section, which is location-dependent and has a direction-dependent effect via the optical unit, is respectively defined by a combination of multiple SPAD lines, wherein the section "rolls" back-and-forth over the SPAD array 10 in a direction perpendicular to the SPAD lines, depending on the present transmission direction, similarly to a rolling shutter window 19 which is variable in the height 18. This definition of sections has the advantage, for example, of a simplified actuation electronics unit, wherein, for example, furthermore the height 18 of the present section 19 can be adapted to the beam diameter of the received radiation 15, for example, as a function of a distance-dependent change of the light spot size.

An SPAD array configured in this manner is suitable, for example, if the beam deflection by the deflection element 12 (see FIG. 2a) is deflected substantially one-dimensionally, i.e., along a deflection direction corresponding to the "rolling direction".

Furthermore, the total station and the SPAD assembly 10 can be configured, for example, such that a position of incidence 20 of the received radiation 15 on the receiver, or the SPAD assembly 10, respectively, can be derived, for example, by means of focal point determination or maximum determination of the reception signal. By way of the position of incidence 20 thus derived, the present section 19 can still be finely adapted in real time to the beam diameter of the received radiation 15. Moreover, based on the derived position of incidence 20 and the distance measurement data corresponding thereto, for example, the associated transmission direction can be derived, for example, to check angle data with respect to the transmission direction, for example, based on control signals of the deflection element 12, or if necessary to derive an item of correction information with respect to the angle data.

Figure 3B:
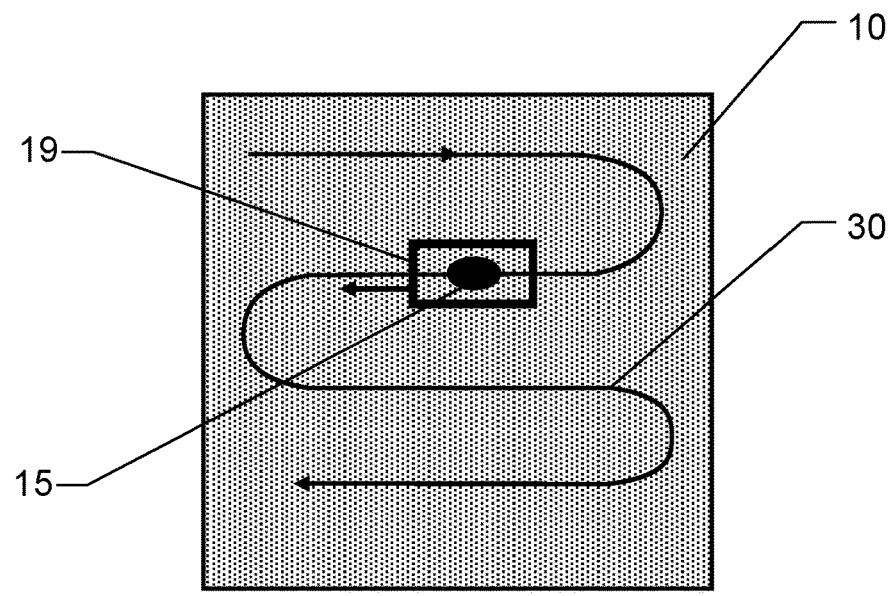

FIG. 3b shows the receiving surface of an SPAD assembly 10 having a section 19, which is dependent on the transmission direction and is displaced in the two-dimensional direction. The movement track 30 of the light spot 15 on the SPAD array 10 and thus the path of the section 19 is shown, i.e., the active microcells which move as a domain in a scanning path over the surface of the SPAD array 10. The respective sections are associated with a transmission direction of the transmitting unit here. If the direction of the transmitted beam moves, for example, in the form of a serpentine line 30, the active section 19 thus moves synchronously in a similar manner on the SPAD assembly 10. It is also apparent here that the background light is practically separated from the receiving channel by means of the small active section. Furthermore, because of the small active receiving surface, the Johnson noise and further area-proportional electronic noise contributions are reduced.

Figure 4:
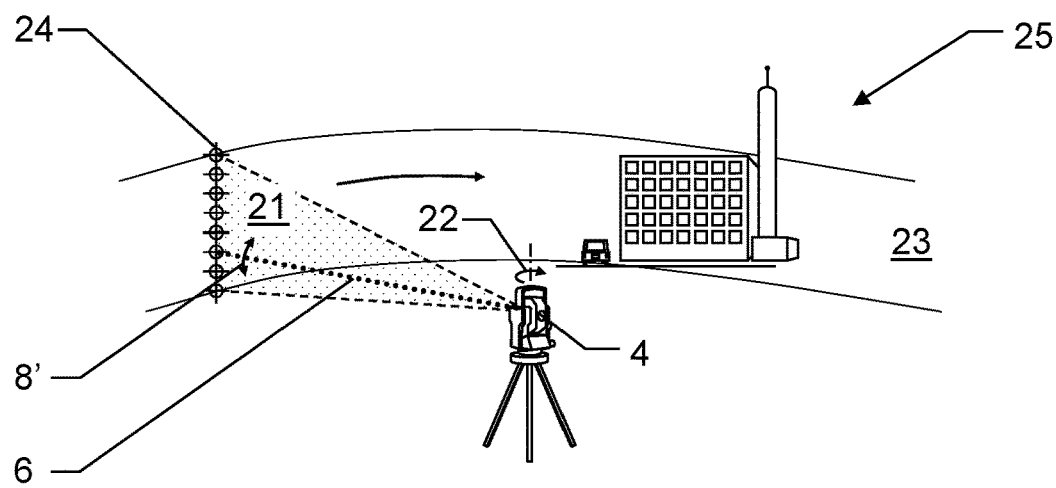
FIG. 4 shows a further embodiment of a total station according to the present disclosure, having a deflection of the distance measuring beam in relation to the carrier solely with respect to a single deflection direction.

FIG. 4 shows a further embodiment of a total station according to the present disclosure, wherein the deflection of the distance measuring beam 6 takes place here such that the distance measuring beam 6 is deflected in relation to the carrier 4 only with respect to a single deflection direction, for example, vertically here. For a present azimuthal alignment of the support 2 (FIG. 1), a present scanning plane 21 for this alignment is thus defined with respect to the carrier 4, which contains possible target axes defined by the beam deflection element 12 (see FIG. 2a).

In particular, the total station can now, for example, have a preprogrammed measurement procedure comprising an azimuthal rotation 22 of the support about the first axis of rotation 3 (see FIG. 1) and a scanning by means of a beam deflection element 12 in the carrier 4, wherein the rotational velocity of the azimuthal rotation 22 of the support 2 is small in comparison to the deflection rate of the (one-dimensional) deflection 8' by the beam deflection element 12.

For example, the overall detector surface defined by the sensor can thus have an oblong, in particular rectangular shape, wherein a long and a short receiver axis are defined, and the receiving channel can be configured such that the scanning plane is imaged on the detector surface along the long receiver axis. In particular, the acquisition region can "roll" up and down over the sensor 10 here, for example, similarly to a rolling shutter window 19 (see FIG. 3) in a direction perpendicular to the sensor lines (with respect to the vertical direction here), depending on the present transmission direction.

The distance measuring beam 6 travels along and, for example, automatically scans a two-dimensional scanning grid or scanning band 23 comprising multiple scanning points 24 and finally generates a 3D point cloud by way of the azimuthal rotation 22 and the deflection 8' by means of the beam deflection element 12.

Therefore, for example, a rapid scanning procedure for an automatic scanning of an environment can thus take place, for example, to acquire a building 25 in the environment.

The total station is furthermore capable, for example, of carrying out a preprogrammed measurement procedure consisting of a combination of an azimuthal rotation 22 of the support 2, a vertical movement of the carrier 4, and a scanning by means of a beam deflection element 12 in the carrier 4. The rotational velocities and accelerations with respect to the two axes 3 and 5 are small in this case in comparison to the dynamic movements of the beam deflection element 12 to generate the (one-dimensional) deflection 8'. During this measurement procedure, not only panorama recordings but rather, for example, a set of zonal 360° recordings are possible, which comprise the entire half space. Further examples are meandering paths, generated by moving the support 2 and the carrier 4, in order, together with the rapid scanning movement, to record a scene in a rectangular field of view with arbitrary angle extension having homogeneous point distribution in a short measuring time.

Figure 5:
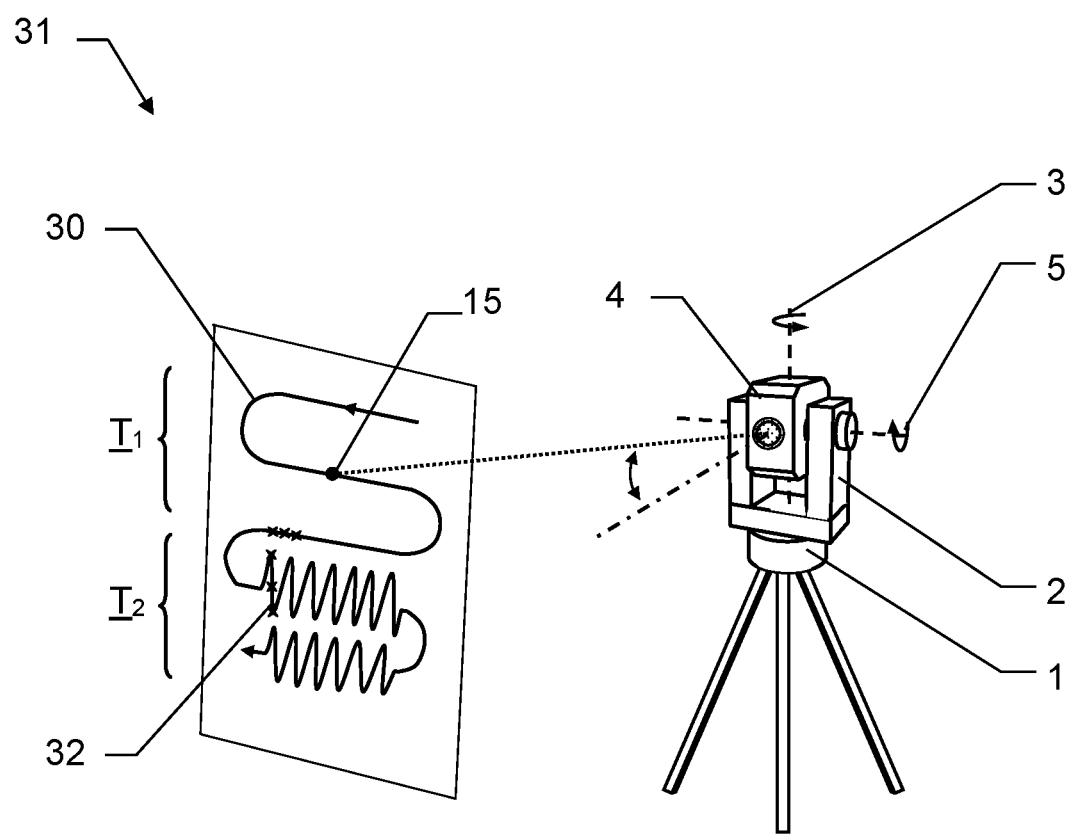
FIG. 5: shows a coordinate measuring instrument according to some embodiments of the present disclosure comprising two-step scanning mechanism based on a receiver-side SPAD array.

FIG. 5 shows a total station according to some embodiments of the present disclosure. The motorized orthogonal axes of the instrument for rotating the support 2 and the carrier 4 more or less form the first step of a scanning mechanism, the rapidly scanning deflection element in the carrier 4 (not shown) acts as the second step, which can additionally deflect the transmitted beam with high speed and acceleration.

The figure furthermore schematically shows a scanning pattern 31 in the object space, shown as a movement track 30 of the light spot 15. The object is symbolized here as a scanning plane, on which an S-shaped scanned path 30 arises, for example. In a first part T1 of the path, only the support 2, or the carrier 4, respectively, is moved about its respective axis of rotation 3, 5. In a second part T2 of the path 30, in contrast, a denser surface coverage is achieved by means of the rapidly moving deflection element in the carrier. This effectuates a more uniform distribution of the point density on the object surface to be scanned, in particular at very high distance measuring rates of greater than 1 MHz.

Without the rapidly scanning deflection element, the measurement points 32 would come to rest densely on a line of the track 30, however, measurement points would be absent between the lines. Rapid tracking of the field of view is also required on the receiver side. By means of the sensor according to some embodiments of the present disclosure, as described, for example, with respect to FIGS. 3a, b, an active section of the sensor, which is chronologically and spatially synchronized with the transmission direction, is displaced in a one-dimensional or two-dimensional direction, and therefore the signal of the associated laser emission can be relayed in a time-resolved manner to a distance measuring device from a group of microcells.

Figure 6A:
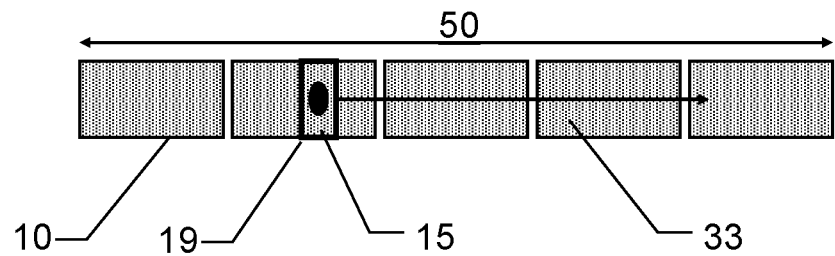
FIGS. 6a,b: show a linear multi-pixel assembly consisting of multiple SPAD arrays for a large-angle scanning region.
Figure 6B:
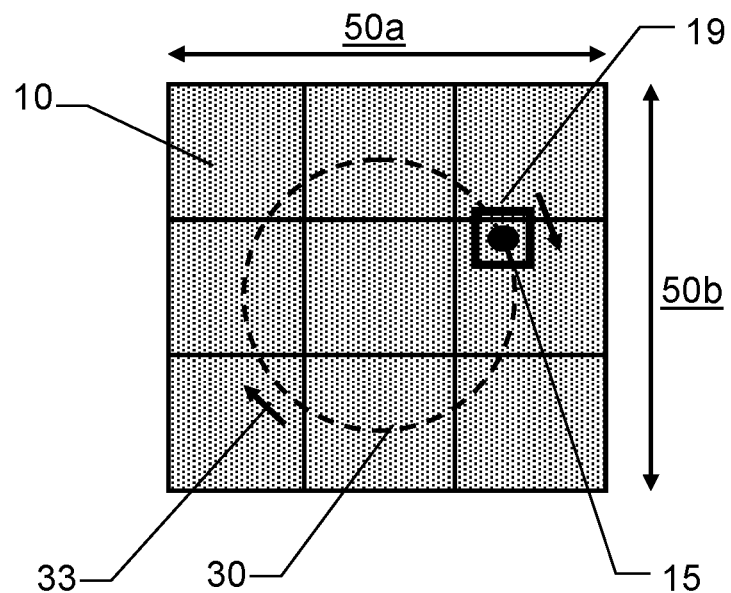

FIGS. 6a and 6b show two further embodiments according to the present disclosure of a photosensor unit suitable for so-called "solid-state scanning". In FIG. 6a, the photosensor unit consists of multiple SPAD arrays 10 arranged in a line. This arrangement is suitable, for example, for scanning larger angle ranges in the object space. The received laser spot 15 moves in this case over the multiple SPAD arrays 10. The active section 19 is moved chronologically and spatially synchronized with the received light spot 15, and therefore the measurement signal can be efficiently received, but at the same time as little ambient light per microcell as possible is acquired. The displacement of the section 19 appears as a virtual movement 33 and is indicated in the arrow direction. The achievable field-of-vision 50 of the receiving unit can be dimensioned in a simple manner by means of the number of individual SPAD arrays 10.

In FIG. 6b, multiple SPAD arrays 10 are illustrated in a two-dimensional multi-pixel arrangement. Each pixel is a separate SPAD array 10. The achievable two-dimensional field-of-vision 50a, b is defined here by way of example by a 3×3 arrangement of individual SPAD arrays 10. In order that the overall detection surface does not have gaps, for example, SPAD arrays 10 without edge regions can be used. In this example, the movement of the received laser spot 10 describes a circular path 30, wherein the active section 19 encompasses the laser spot 15 and is actuated in such a manner that it moves with the laser spot 15 along a virtual movement 33.

If the microcell domain 19 is located completely on a single SPAD array 10, the received signal of all microcells within the domain is then, for example, output at a single output signal line. In contrast, if the microcell domain 19 overlaps two adjacent SPAD arrays, then two output signal lines are activated, for example, which can then be combined outside the multi-pixel SPAD array assembly via a multiplexer circuit. However, for example, it is also conceivable that this signal combining electronics unit can be implemented directly on the SPAD array pixels 10 (SPAD array chips).

Figure 7:
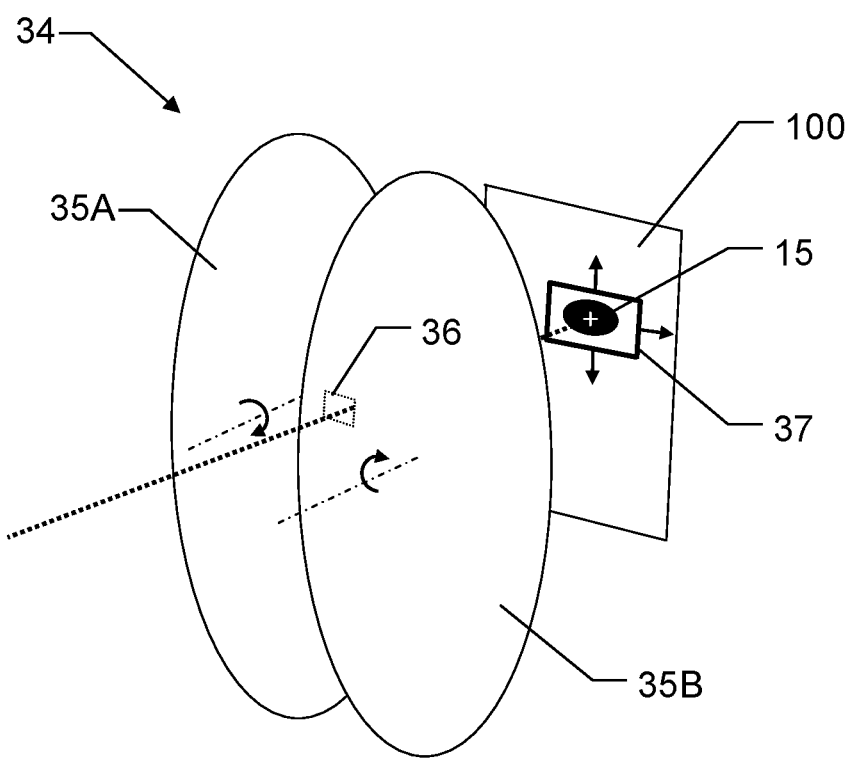
FIG. 7 shows mechanical generation of direction-dependent acquisition regions of the receiver adapted to imaging positions of the received radiation on the detector surface.

FIG. 7 schematically shows a receiver, which has on the received radiation side a settable blocking element 34 which is radiation-opaque to the received radiation, designed here as two settable rotatable disks 35A, 35B, arranged substantially parallel to the overall detector surface 100, for example, a large-area photodiode, which are made of material radiation-opaque to the received radiation 15, and which each have defined radiation-transmissive openings (not shown) for the received radiation 15.

For example, the openings can each be formed/coded on the two rotating disks 35A, 35B such that a set of defined opening combinations is settable by defined rotation settings of the two disks, and therefore a set of individually defined transmission regions 36 for generating a finite number of acquisition regions 37 of the detector surface 100 are settable. Alternatively, for example, the openings can also be formed such that the active acquisition region 37 of the overall detector surface 100 defined by the rotation of one or both disks completes a two-dimensional continuous movement over the overall detector surface 100.

The effective detection surface of the photodiode is thus restricted by means of interaction of the two disks substantially on the lateral cross section of the distance measuring beam imaged on the overall detector surface, and therefore the respective location dependent on the transmission direction of the distance measuring beam of the received radiation imaged on the photodiode is taken into consideration and interfering ambient light (lateral to the received beam) is suppressed.

It is obvious that these illustrated figures only schematically represent possible exemplary embodiments. The various approaches can also be combined with one another and with methods of other systems.

The invention claimed is:

1. A total station or theodolite for acquiring a position of a target, comprising:
   a radiation source for generating a transmitted radiation,
   a base,
   a support, which is fastened on the base so it is rotatable about a first axis of rotation,
   a carrier, which is fastened on the support so it is rotatable about a second axis of rotation, which is substantially orthogonal to the first axis of rotation, wherein the carrier has:
      an exit optical unit for emitting a distance measuring beam provided by at least a part of the transmitted radiation and defining a targeting axis,
      a settable beam deflection element, which is configured to deflect the distance measuring beam in such a manner that the targeting axis is variable in a defined manner in relation to the carrier by means of actuation of the beam deflection element, and
      a receiver comprising an overall detector surface, wherein the receiver is configured to acquire distance measurement data based on at least a target reflected part of the returning distance measuring beam incident on the receiver, referred to as received radiation,
   a support angle encoder for acquiring first angle data with respect to a rotation of the support about the first axis of rotation,
   a carrier angle encoder for acquiring second angle data with respect to a rotation of the carrier about the second axis of rotation,
   an angle determining unit for acquiring third angle data with respect to the alignment of the targeting axis in relation to the carrier, and
   a computer unit, which is configured to derive the position of the target based on the distance measurement data and the first, the second, and the third angle data,
   wherein:
   the total station or the theodolite is configured such that a setting of a section of the overall detector surface as an active acquisition region is carried out,
   wherein setting of the active acquisition region is carried out in a chronologically variable manner with respect to its position on the overall detector surface,
   a receiver signal dependent on the setting of the active acquisition region is generated by received radiation incident on the overall detector surface, and the total station or the theodolite has a control electronics unit, wherein the control electronics unit is configured for the ongoing setting of the active acquisition region, adapted to the actuation of the beam deflection element, and to derive the distance measurement data based on the receiver signal.

2. The total station or theodolite according to claim 1, wherein:
the receiver has, on the received radiation side, a blocking element which is radiation-opaque to the received radiation,
the blocking element is configured such that a chronologically variable settable transmission region is set to transmit the received radiation to the overall detector surface, wherein
the position of the transmission region is settable with respect to the overall detector surface, the transmission region is furthermore settable with respect to one or both of a shape and a dimension.

3. The total station or theodolite according to claim 2, wherein:
the blocking element is formed based on a settable rotatable disk arranged substantially parallel to the overall detector surface made of material radiation-opaque for the received radiation, which has a radiation-transmissive opening for the received radiation.

4. The total station or theodolite according to claim 1, wherein:
the receiver has an optoelectronic sensor based on an assembly of microcells, the sensor is designed as an assembly of single-photon avalanche diodes,
the sensor has a plurality of microcells and is configured such that the microcells can be read out one or both of individually and in microcell groups and sections of the receiver which can be read out individually are thus settable, and
the control electronics unit is configured for the ongoing setting of different sections respectively defining the active acquisition region.

5. The total station or theodolite according to claim 1, wherein:
the control electronics unit is configured for the synchronization of the actuation of the beam deflection element and the setting of the active acquisition region is based on at least one of:
the third angle data,
a distance to the target, and
a signal runtime to the target.

6. The total station or theodolite according to claim 1, wherein:
the carrier has an optical receiving channel for imaging the received radiation on the receiver, wherein the receiving channel is configured such that the imaging effect of the receiving channel is substantially independent of the actuation of the beam deflection element, the beam deflection element is arranged such that it solely acts on the transmitted radiation.

7. The total station or theodolite according to claim 1, wherein:
the beam deflection element is configured such that the deflection of the distance measuring beam takes place such that the distance measuring beam is deflected in relation to the carrier only with respect to two different deflection directions, which are orthogonal to one another.

8. The total station or theodolite according to claim 1, wherein:
the beam deflection element is configured such that the deflection of the distance measuring beam takes place in such a manner that the distance measuring beam is deflected in relation to the carrier only with respect to a single deflection direction, whereby a scanning plane containing the distance measuring beam is defined with respect to the carrier wherein:
the overall detector surface has an oblong and rectangular shape, whereby a long and a short receiver axis are defined, and
the receiving channel is configured such that the scanning plane is imaged on the overall detector surface along the long receiver axis.

9. The total station or theodolite according to claim 4, wherein:
the sensor is configured such that the individual sections each represent a spatial sequence of adjacent microcells, each individual section corresponds to at least one line or at least one column of the sensor.

10. The total station or theodolite according to claim 4, wherein:
the total station or the theodolite is configured:
to derive a position of incidence of the received radiation on the receiver by means of focal point determination or maximum determination of the acquired received radiation, and
to derive an item of correction information with respect to the third angle data based on the position of incidence and the distance measurement data.

11. The total station or theodolite according to claim 1, wherein:
the total station or the theodolite is configured:
based on the third angle data, to estimate a first item of imaging information for one or both of a beam shape and location of the received radiation imaged on the receiver based on a defined fixed-focus optical unit, or
based on a distance to the target, to estimate a second item of imaging information for one or both of a beam shape and location of the received radiation imaged on the receiver, and
the active acquisition region is set based on one or both of the estimated first and second item of imaging information.

12. The total station or theodolite according to claim 4, wherein:
the total station or the theodolite is configured, based on a feedback of the receiver with respect to previously acquired received radiation, to estimate a third item of imaging information for one or both of a beam shape and location of the received radiation imaged on the receiver, wherein the section defining the active acquisition region is set based on the estimated third item of imaging information.

13. The total station or theodolite according to claim 4, wherein:
the receiver has multiple sensors, wherein the multiple sensors are arranged one-dimensionally or two-dimensionally in relation to one another, each sensor has one or both of a separate actuation electronics unit and analysis electronics unit.

14. The total station or theodolite according to claim 1, wherein the control electronics unit is configured to control the total station or the theodolite based on a preprogrammed measuring procedure, wherein a sweeping scanning is carried out by means of the distance measuring beam by way of the measuring procedure and the measuring procedure has:
- a first step, which defines a movement of the support about the first axis of rotation and/or a movement of the carrier about the second axis of rotation, and
- a second step, which defines the actuation of the beam deflection element and a movement of the distance measuring beam in relation to the carrier, wherein:
the second step is overlaid on the first step,
the movement of the distance measuring beam takes place at a higher speed in comparison to the movements of the support and the carrier, and
different active acquisition regions are respectively set based on the third angle data, and therefore respective active acquisition regions set at different points in time are each aligned in the direction of the respective distance measuring beam imaged in a timely manner on the target, wherein a sensor according to claim 4 is used and at the respective different points in time, the respective set section of the sensor, which can be individually read out, is connected to the signal output of the sensor,
the active acquisition regions are respectively set such that the respective field of view of the receiver defined by an active acquisition region encompasses the distance measuring beam imaged on the receiver such that the ratio between the area of the distance measuring beam imaged on the respective active acquisition region and the area of the respective active acquisition region is greater than a defined threshold value.

15. The total station or theodolite according to claim 4, wherein:
the receiver is designed such that a set of sections which can be read out chronologically in parallel is settable, and
the radiation source is configured:
- to generate one or both of a bundle of differently oriented and spaced-apart laser measuring beams generated in parallel, and
- the sections of the set of sections which can be read out chronologically in parallel are set such that they are each associated with one laser measuring beam of the bundle of laser measuring beams.

16. The total station or theodolite according to claim 1, wherein the setting of the active acquisition region is furthermore carried out in one or both of a shape and a dimension.

* * * * *